United States Patent [19]

Ohnishi et al.

[11] Patent Number: 5,186,120

[45] Date of Patent: Feb. 16, 1993

[54] MIXTURE THIN FILM FORMING APPARATUS

[75] Inventors: Hiroshi Ohnishi; Susumu Hoshinouchi, both of Amagasaki, Japan

[73] Assignee: Mitsubishi Denki Kabushiki Kaisha, Tokyo, Japan

[21] Appl. No.: 801,627

[22] Filed: Dec. 4, 1991

Related U.S. Application Data

[63] Continuation of Ser. No. 492,747, Mar. 13, 1990, abandoned.

[30] Foreign Application Priority Data

Mar. 22, 1989 [JP] Japan ................................. 1-71293

[51] Int. Cl.$^5$ ............................................. C23C 16/00
[52] U.S. Cl. ................................... 118/667; 118/715; 118/724; 118/726
[58] Field of Search ............... 118/667, 688, 715, 724, 118/726, 719

[56] References Cited

U.S. PATENT DOCUMENTS

| | | | |
|---|---|---|---|
| 4,286,545 | 9/1981 | Takagi et al. | 118/726 |
| 4,401,052 | 8/1983 | Baron et al. | 118/726 |
| 4,619,844 | 10/1986 | Pierce et al. | 118/688 |
| 4,793,282 | 12/1988 | Greenberg et al. | 118/667 |

FOREIGN PATENT DOCUMENTS 63-90121  4/1988  Japan .
64-2668   1/1989  Japan .

OTHER PUBLICATIONS

Prabhu, R. S., "Chemical Vapor Deposition of Molybdsnum", IBM Technical Disclosure Bulletin, vol. 13, No. 9, Feb. 1971, p. 2535.

Primary Examiner—W. Gary Jones
Assistant Examiner—Todd J. Burns
Attorney, Agent, or Firm—Oblon, Spivak, McClelland, Maier & Neustadt

[57] ABSTRACT

The present invention is directed to a mixture thin film forming apparatus for accumulating gasified components on a substrate which is arranged in a reaction chamber. According to the present invention, respective components of a gas supply system, which are different in heat capacity from each other, are independently controlled in their temperatures by temperature control parts respectively, so that the respective components can be adjusted to desired temperatures. Thus, the gas supply system is prevented from deviation of temperature distribution, whereby the overall gas supply system can be adjusted within a prescribed temperature range. Thus, raw materials are prevented from precipitation, irregular reaction or the like, to enable stable gas supply.

3 Claims, 6 Drawing Sheets

MIXTURE THIN FILM FORMING APPARATUS

This application is a continuation of application Ser. No. 07/492,747, filed on Mar. 13, 1990, now abandoned.

BACKGROUND OF THE INVENTION

1. Field of the Invention

The present invention relates to a mixture thin film forming apparatus, and more particularly, it relates to an apparatus for forming a thin film through a solid raw material, such as an oxide high-temperature superconducting thin film, for example, which is gasified at a relatively high temperature.

2. Description of the Prior Art

As disclosed in Japanese Patent Publication Gazette No. 2668/1989, for example, it has been pointed out that the raw material gas is precipitated on a cooled portion by thermal conduction loss or the like when a solid raw material which is gasified at a high temperature of 150° to 200° C. is employed for this type of apparatus. This literature takes up a gas introducing part for a reaction pipe, and proposes a method of preventing cooling of the gas introducing part caused by thermal conduction loss. In such case of employing a single raw material, a gas passage for the gas introducing part has been simple and it has been unnecessary to pay much attention to the temperature except for the gas introducing part.

In a compound thin film forming apparatus represented by that for forming a GeAs thin film, on the other hand, a gas passage of its gas supply system is extremely complicated for the following reason, as disclosed in Japanese Patent Laying-Open Gazette No. 90121/1988, for example:

When a solid raw material is sublimated for employment as a raw material gas, the amount of supply of the gas is controlled by the flow rate of a carrier gas which is controlled by a mass flow controller or the like. In order to control the amount of the raw material gas, therefore, it is necessary to maintain the raw material gas, which is contained within a constant volume of the carrier gas, in a constant amount. Therefore, it is necessary to maintain the gas pressure in a sublimation chamber constant in order to eliminate time change of the amount of the gas which is sublimated and generated from the solid raw material. Consequently, the gas passage is complicated.

Such a conventional compound thin film forming apparatus has been developed while taking into consideration the case of employing a sublimable solid raw material such as trimethylgallium, for example, which can sufficiently take vapor pressure at the room temperature, and not much attention has been paid to temperature control of portions other than the gas supply system, particularly the sublimation chamber.

On the other hand, a recently discovered solid material for forming a thin film of an oxide high-temperature superconductor is hardly gasified around the room temperature, and a high temperature of at least 100° C. is required for gasifying this material. In order to employ such a solid raw material, it is necessary to prevent precipitation of the raw material gas by maintaining the gas supply system at a temperature higher than the gasification temperature. Further, it is also necessary to prevent the gas supply system from abnormal temperature rise, to thereby prevent irregular reaction of the raw material gas. Thus, the gas supply system must be controlled within a prescribed temperature range.

However, respective components of the gas supply system are different in heat capacity from each other. If the temperatures of the components of the gas supply system are commonly controlled by a single temperature control part, therefore, large temperature differences are caused between the components. As the result, it is impossible to control the overall gas supply system within the aforementioned prescribed temperature range, and hence precipitation is caused by low temperatures or irregular reaction etc. is caused by high temperatures. Thus, it has been impossible to stably supply the gas.

SUMMARY OF THE INVENTION

The present invention is directed to a mixture thin film forming apparatus, which is adapted to accumulate gasified components on a substrate which is arranged within a reaction chamber.

A mixture thin film forming apparatus according to the present invention comprises a reaction chamber for accumulating gasified components on a substrate, a plurality of sublimation chambers containing a plurality of solid raw materials which are different in gasification temperature from each other, a gas mixing part for mixing the gases, a plurality of gas deriving pipes connecting the plurality of sublimation chambers with the gas mixing part respectively for transporting raw material gases of the respective solid raw materials gasified in the respective sublimation chambers to the gas mixing part respectively, a gas transport system connecting the gas mixing part with the reaction chamber for transporting the raw material gases mixed with each other by the gas mixing part to the reaction chamber, and a plurality of temperature control parts for independently controlling temperatures of the respective sublimation chambers, the gas mixing part, the respective gas deriving pipes and the gas transport system respectively.

Accordingly, a principal object of the present invention is to provide a mixture thin film forming apparatus, which can stably supply gases in the case of employing raw materials which are gasified at high temperatures.

According to the present invention, respective components of a gas supply system, which are different in heat capacity from each other, can be adjusted to desired temperatures respectively by independently controlling the temperatures of the components by temperature control parts. Thus, the gas supply system is prevented from deviation of temperature distribution, whereby the overall gas supply system can be controlled within a prescribed temperature range. Thus, the raw material gases are prevented from precipitation or irregular reaction, to enable stable supply of the gases.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
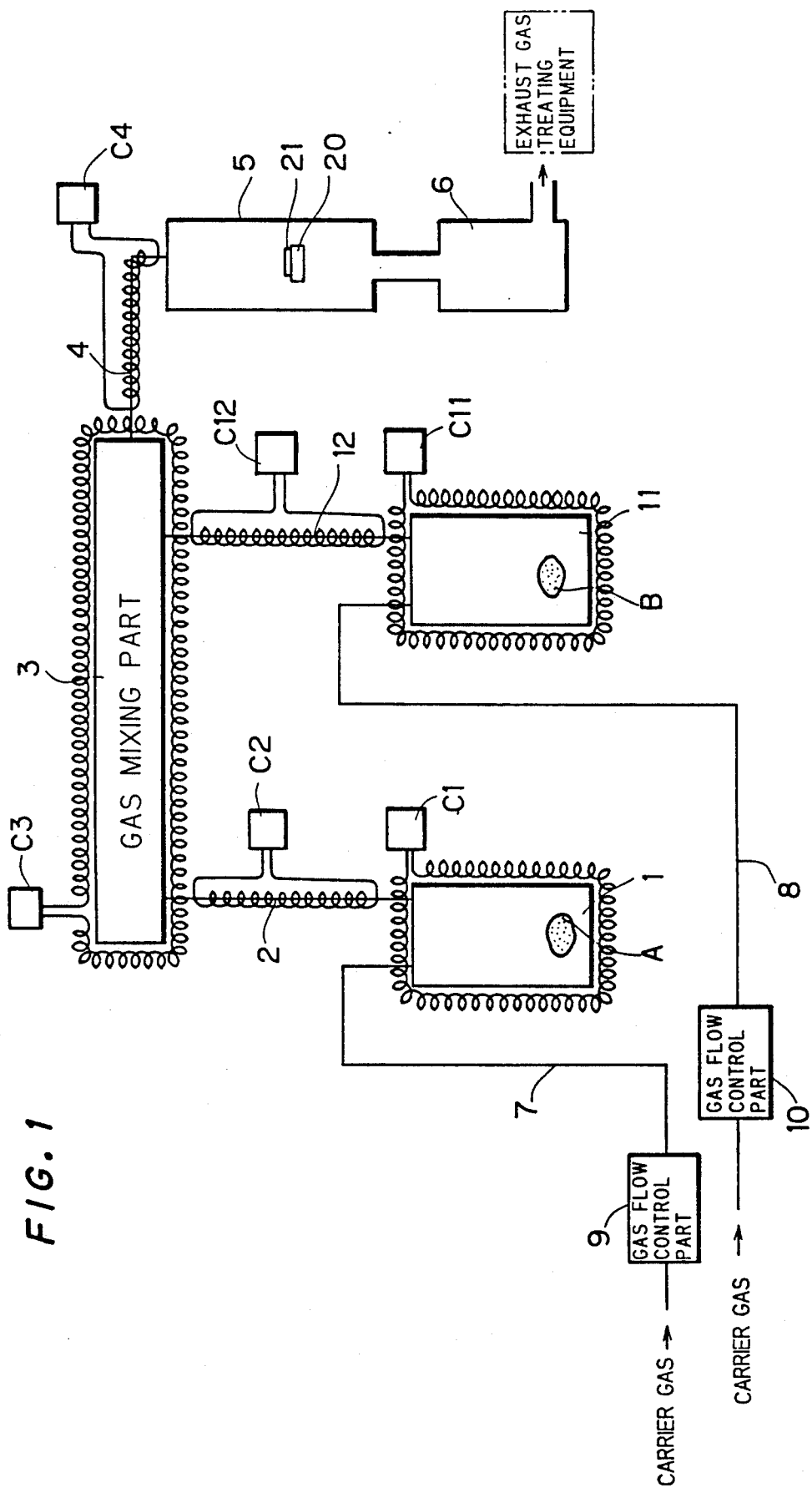
FIG. 1 is a schematic block diagram showing a mixture thin film forming apparatus according to a first embodiment of the present invention.

FIG. 1 is a schematic block diagram showing a mixture thin film forming apparatus according to a first embodiment of the present invention. As shown in FIG. 1, first and second sublimation chambers 1 and 11 are connected to a gas mixing part 3 through first and second gas deriving pipes 2 and 12 respectively. The gas mixing part 3 is connected to a reaction chamber 5 through a gas transport system 4. The reaction chamber 5 is connected to an exhaust system 6, which is connected to exhaust gas treating equipment. Further, the first and second sublimation chambers 1 and 11 are respectively connected with carrier gas introducing pipes 7 and 8, which are provided with carrier gas flow control parts 9 and 10 for regulating volumes of carrier gases which are supplied to the sublimation chambers 1 and 11.

Independently operating temperature control parts C1, C11, C2, C12, C3 and C4 are provided on the respective components of the gas supply system, i.e., the first and second sublimation chambers 1 and 11, the first and second gas deriving pipes 2 and 12, the gas mixing part 3 and the gas transport system 4 respectively. The temperature control parts C1, C11, C2, C12, C3 and C4 are driven to independently control the temperatures of the respective components 1, 11, 2, 12, 3 and 4 of the gas supply system.

In order to form a thin film in the inventive mixture thin film forming apparatus through first and second solid raw materials A and B such as $Y_3(C_{11}H_{19}O_2)_2$ and $Cu_2(C_{11}H_{19}O_2)_2$, for example, which are gasified at temperatures higher than 100° C. (37.3 K), the first solid raw material A having a lower gasification temperature is introduced into the first sublimation chamber 1, while the second solid raw material having a higher gasification temperature is introduced into the second sublimation chamber 11 respectively. A substrate 20, which is formed of a silicon wafer, MgO, YsZ or the like, is arranged in the reaction chamber 5. Temperatures are controlled by the temperature control parts C1, C11, C2, C12, C3 and C4 to satisfy $T1 \leq T2 \leq T3$ and $t1 > 100° C. \leq T4$ and $t1 < t2 < T3$ assuming that t1 represents the set temperature of the first sublimation chamber 1, T1 represents that of the second sublimation chamber 11, t2 represents that of the first gas deriving pipe 2, T2 represents that of the second gas deriving pipe 12, T3 represents that of the gas mixing part 3, and T4 represents that of the gas transport system 4. In this case, further, t1 and T1 are set to be equal to the gasification temperatures of the first and second solid raw materials A and B respectively, while T4 is adjusted to be below a prescribed temperature, to prevent irregular reaction of the raw material gases, as hereinafter described.

In this state, a carrier gas such as an inert gas, the flow of which is controlled by the gas flow control part 9, is introduced into the first sublimation chamber 1. Thus, the raw material gas of the first solid raw material A (hereinafter referred to as "first raw material gas"), which is gasified in the first sublimation chamber 1, is fed to the gas mixing part 3 with the carrier gas through the first gas deriving pipe 2.

Similarly, a carrier gas, the flow of which is controlled by the gas flow control part 10, is introduced into the second sublimation chamber 11, and fed into the gas mixing part 3 with the raw material gas of the second raw material B (hereinafter referred to as "second raw material gas") through the second gas deriving pipe 12.

The first and second raw material gases thus fed into the gas mixing part 3 are mixed with each other and fed into the reaction chamber 5 through the gas transport system 4. Within the reaction chamber 5, the gasified components of the raw material gases are accumulated on the substrate 20, to form a thin film 21.

According to this mixture thin film forming apparatus, the set temperatures t1, t2, T3 and T4 of the first sublimation chamber 1, the first gas deriving pipe 2, the gas mixing part 3 and the gas transport system 4 are controlled to exceed the gasification temperature of the first solid raw material A in the gas passage of the first raw material gas, to prevent precipitation of the first raw material gas. Further, the set temperatures T1, T2, T3 and T4 of the second sublimation chamber 11, the second gas deriving pipe 12, the gas mixing part 3 and the gas transport system 4 are set to exceed the gasification temperature of the second solid raw material B in the gas passage for the second raw material gas, to prevent precipitation of the second solid raw material B.

Further, the respective components 1, 11, 2, 12, 3 and 4 of the gas supply system, which are different in heat capacity from each other, are so independently controlled in their temperatures that the set temperatures t1, T1, t2, T2, T3 and T4 of the components 1, 11, 2, 12, 3 and 4 can be correctly adjusted at desired values. Thus, the gas supply system is prevented from deviation of temperature distribution such as partial abnormal temperature rise, for example, thereby preventing irregular reaction of the raw material gases.

The temperatures are controlled to be gradually increased ($T1 \leq T2 \leq T3 \leq T4$) in the gas passage for the second solid raw material B, whereby the temperature distribution within the passages for carrying the raw material gases can be stabilized for temperature control.

The first raw material gas, which is lower in gasification temperature, passes through the first gas deriving pipe 2 whose temperature is set at t2 before the same is fed into the gas mixing part 3 having a high temperature (T3), whereby the temperature of this raw material gas is raised up to t2. Thus, the temperature of the raw material gas is adjusted between the first gas deriving pipe 2 and the gas mixing part 3 ($t1 < t2 < T3$), so that the raw material is not directly fed into the high-temperature gas mixing part 3 in a low-temperature state. Thus, the gas mixing part 3 is prevented from abrupt temperature reduction caused by introduction of a low-temperature gas, and the temperature of the gas mixing part 3 can be accurately controlled. Further, temperature distribution within the gas mixing part 3 is uniformalized by sufficient mixing of the gases, to attain accurate temperature control also in this point.

Figure 2:
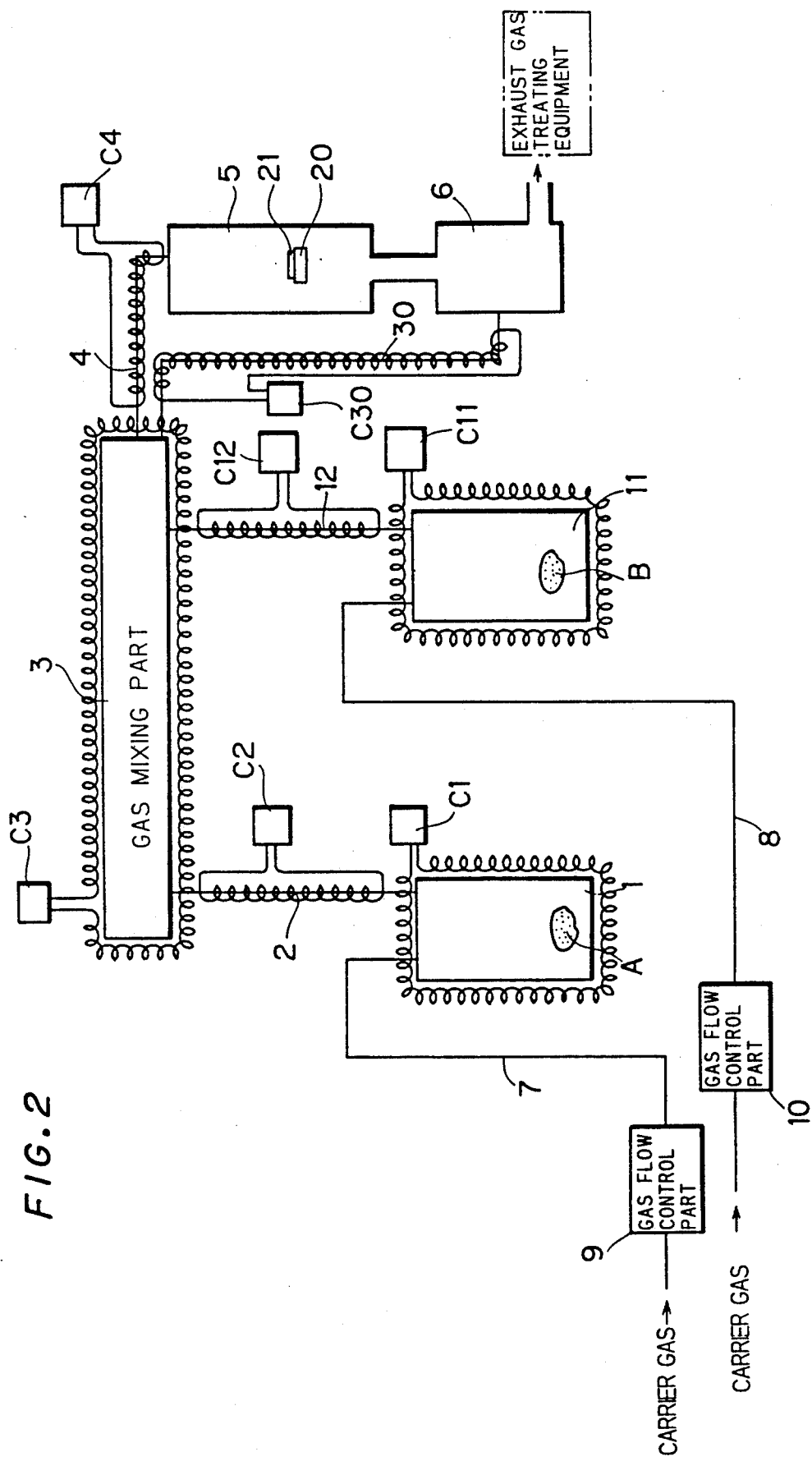
FIG. 2 is a schematic block diagram showing a mixture thin film forming apparatus according to a second embodiment of the present invention.

FIG. 2 is a schematic block diagram showing a mixture thin film forming apparatus according to a second embodiment of the present invention. This apparatus is provided with a discharge line 30, which directly couples a gas mixing part 3 with an exhaust system 6. It is possible to feed raw material gases into a reaction chamber 5 or to directly feed the same into the exhaust system 6 through the discharge line 30 by switching means (not shown) at need. A temperature control part C30 is provided to control the temperature of the discharge line 30 so that no precipitation is caused. Other structure of this embodiment is similar to that of the first embodiment.

When solid raw materials are gasified to be employed as raw material gases, sublimation states are generally instable in an unsteady moment of introducing carrier gases into sublimation chambers 1 and 11. Thus, it is difficult to control the flow of the raw material gases in the unsteady moment. According to the inventive apparatus, however, the raw material gases are exhausted through the discharge line 30 in the unsteady state to feed the raw material gases into the reaction chamber 5 after the sublimation states are stabilized, whereby the flow of the raw materials can be correctly controlled.

When the temperature of the gas mixing part 3 is abnormally raised, high-temperature raw material gases contained therein may be exhausted through the discharge line 30, to lower the temperature of the gas mixing part 3. Thus, the temperature of the gas mixing part 3 can also be accurately controlled.

Figure 3:
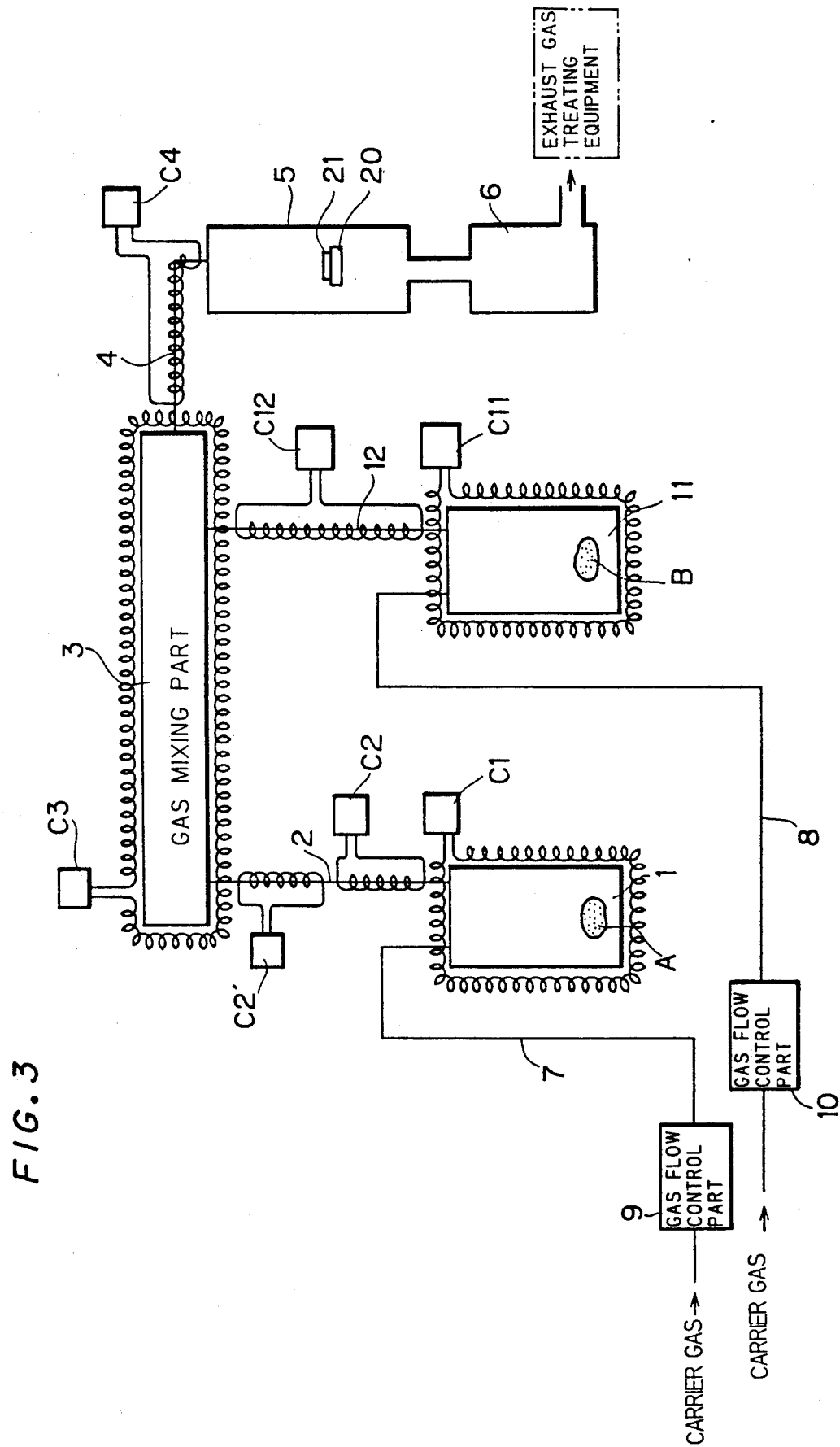
FIG. 3 is a schematic block diagram showing a mixture thin film forming apparatus according to a third embodiment of the present invention.

FIG. 3 is a schematic block diagram showing a mixture thin film forming apparatus according to a third embodiment of the present invention. In this apparatus, a first gas deriving pipe 2 arranged between a first sublimation chamber 1 and a gas mixing part 3 is divided into two temperature control blocks, the temperatures of which are independently controlled by temperature control parts C2 and C2', respectively.

According to this embodiment, the temperature of a first raw material gas can be gradually increased by the temperature control parts C2 and C2' between the first sublimation chamber 1 and the gas mixing part 3. Therefore, the raw material gas can be prevented from abrupt temperature change even if temperature difference between the first sublimation chamber 1 and the gas mixing part 3 is considerably large, whereby the gas temperature can be accurately controlled.

Figure 4:
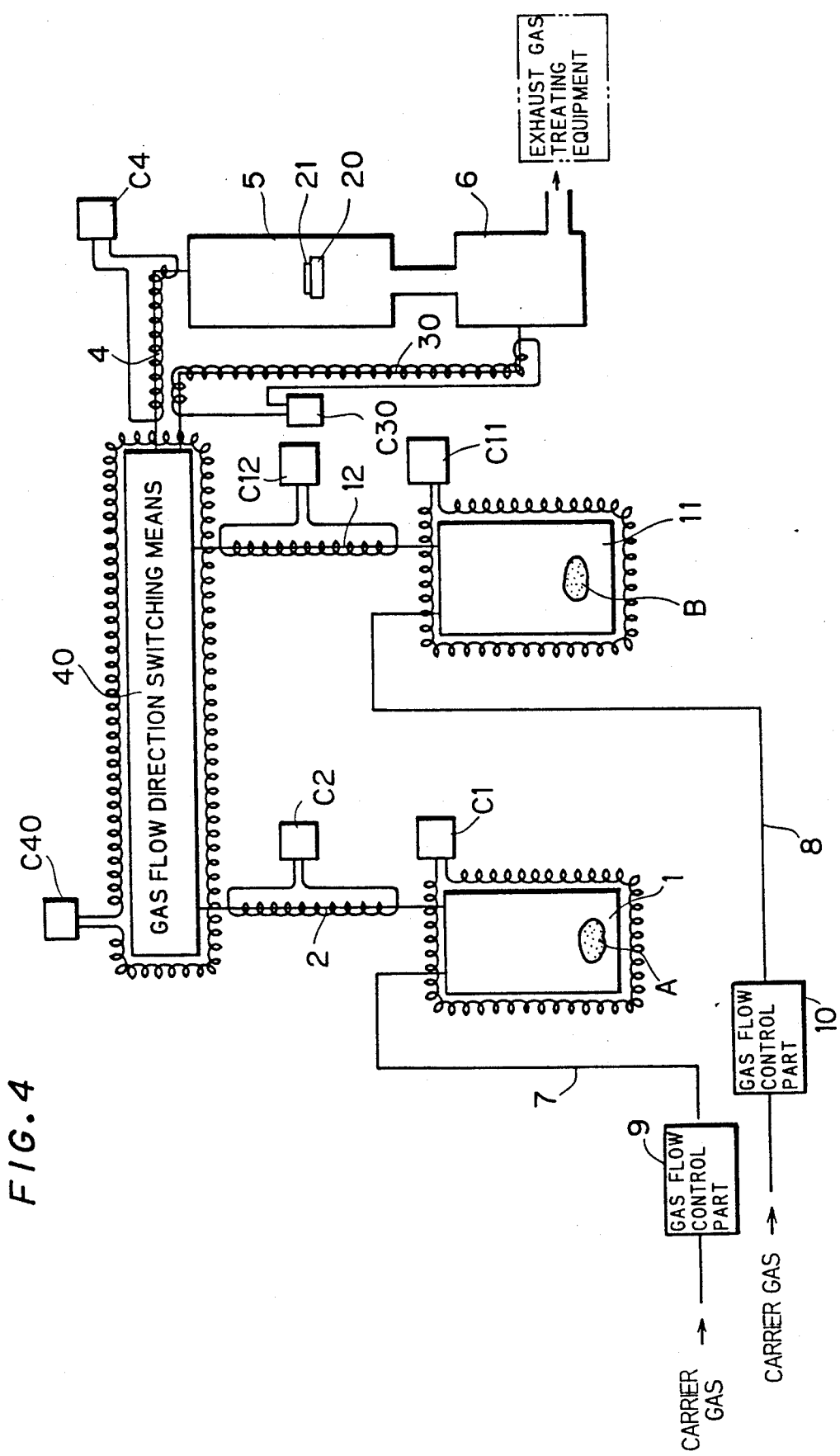
FIG. 4 is a schematic block diagram showing a mixture thin film forming apparatus according to a fourth embodiment of the present invention.

FIG. 4 is a schematic block diagram showing a mixture thin film forming apparatus according to a fourth embodiment of the present invention. In this apparatus, a gas mixing part is formed by gas flow direction switching means 40. This gas flow direction switching means 40 can be arbitrarily switched between a state of feeding only a second raw material gas into a reaction chamber 5 while exhausting a first raw material gas through a discharge line 30 and a state of feeding only the first raw material gas into the reaction chamber 5 while exhausting the second raw material gas through the discharge line 30.

According to this embodiment, the first and second raw material gases are alternately fed into the reaction chamber 5, to thereby form a mixture thin film 21 on a substrate 20. Further, a layer-type mixture having different properties can be formed by changing the mixing rate of the first and second raw material gases during formation of the thin film.

Figure 5:
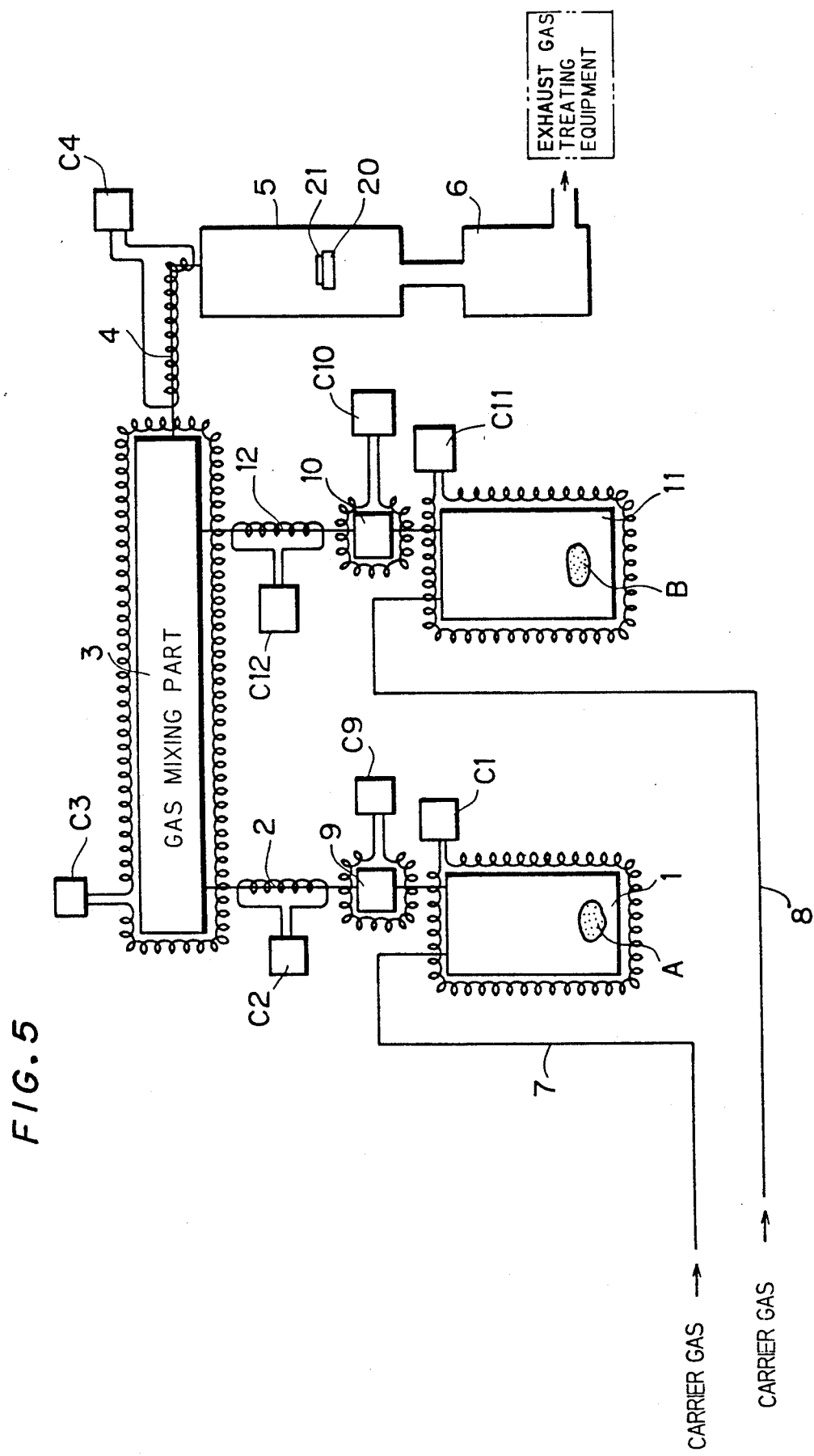
FIG. 5 is a schematic block diagram showing a mixture thin film forming apparatus according to a modification of the present invention.

FIG. 5 is a schematic block diagram showing a mixture thin film forming apparatus according to a modification of the present invention. In this apparatus, gas flow control parts 9 and 10 are arranged between first and second sublimation chambers 1 and 11 and a gas mixing part 3 respectively. Further, temperature control parts C9 and C10 are mounted on the gas flow control parts 9 and 10 respectively, to independently control the temperatures of the gas flow control parts 9 and 10 respectively.

When the gas supply system is provided therein with components such as the gas flow control parts 9 and 10, which are different in heat capacity from each other, the components may be regarded as independent temperature control blocks, the temperatures of which are to be independently controlled.

Figure 6:
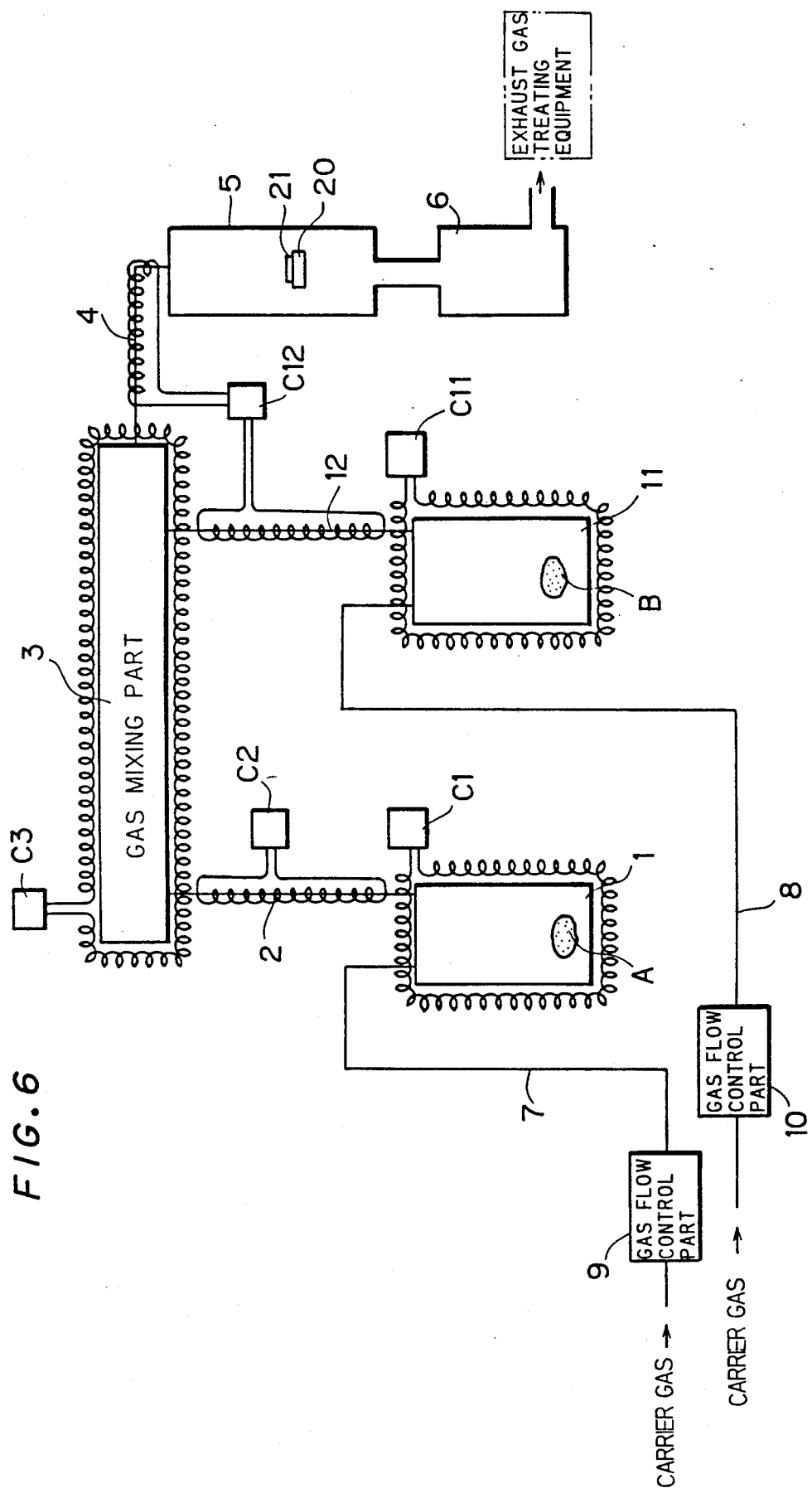
FIG. 6 is a schematic block diagram showing a mixture thin film forming apparatus according to another modification of the present invention.

A second gas deriving pipe 12 and a gas transport system 4 can be controlled by the same temperature control part, as the case may be. When a second gas deriving pipe 12 and a gas transport system 4 are substantially equal in heat capacity to each other and set at the same temperature as shown in FIG. 6, the temperatures of these components can be controlled by a single temperature control part C12, which also serves as a controller and a detecting part.

A switching valve part, which is attached to the aforementioned gas flow direction switching means 40 (see FIG. 4) or the like, can be prepared from a block valve having a piping part and a valve body integrally mounted on the piping part with a small dead space. When such a block valve is employed, gas flows can be instantaneously changed with no loss time, to realize further stable gas supply. In this case, it is preferable to independently control the temperatures of the piping part and the valve body, which are largely different in heat capacity from each other.

While each of the above embodiments has been described with reference to a mixture thin film forming apparatus employing two solid raw materials A and B, the present invention is not restricted to this but is also applicable to a mixture thin film forming apparatus which employs three or more solid raw materials.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mixture thin film forming apparatus for accumulating gasified components on a substrate which is arranged in a reaction chamber, said apparatus comprising:

a plurality of sublimation chambers respectively containing a plurality of solid raw materials being different in gasification temperature from each other;

gas flow direction switching means for mixing gases and switching the flow of said gases;

a plurality of gas deriving pipes respectively connecting said plurality of sublimation chambers with said gas flow direction switching means for respectively transporting raw material gases of said solid raw materials respectively gasified in said sublimation chambers to said gas flow direction switching means;

a gas transport system connecting said gas flow direction switching means with said reaction chamber for transporting said raw material gases mixed by said gas flow direction switching means to said reaction chamber;

discharge line means for connecting said gas flow direction switching means with an exhaust means for transporting said raw material gases in said gas flow direction switching means to said exhaust means;

a plurality of temperature control means for respectively independently controlling temperatures of said sublimation chambers, said gas flow direction switching means, said gas deriving pipes, said gas transport system and said discharge line means;

wherein:

each of said sublimation chambers, said gas flow direction switching means, said gas deriving pipes, said gas transport system and discharge line means have different heat capacities; and said gas flow direction switching means can selectively feed a first raw material gas to said reaction chamber while feeding a second raw material gas to said exhaust means and feed said second raw material gas to said reaction chamber while feeding said first raw material gas to said exhaust means.

2. A mixture thin film forming apparatus in accordance with claim 1, wherein:

said temperature control means is a means for controlling temperatures for satisfying $T1=T2=T3=T4$ and $t1>100°$ C. where $T1$ represents the set temperature of one of said sublimation chambers containing one of said plurality of solid raw materials having the highest gasification temperature, $T2$ represents the set temperature of one of said gas deriving pipes connected to said one of said sublimation chambers, $T3$ represents the set temperature of said gas-mixing part, $T4$ represents the set temperature of said gas transport system and $t1$ is the set temperature of the sublimation chamber in which a solid raw material with the lowest gasification temperature is contained.

3. A mixture thin film forming apparatus in accordance with claim 1, wherein:

said temperature control means is a means for controlling temperatures for satisfying $t1>T1 \leq T2 \leq T3 \leq T4$ where $T1$ represents the set temperature of one of said sublimation chambers containing one of said plurality of solid raw materials having the highest gasification temperature, $T2$ represents the set temperature of one of said gas deriving pipes connected to said one of said sublimation chambers, $T3$ represents the set temperature of said gas mixing part, $T4$ represents the set temperature of said gas transport system and $t1$ is the set temperature of the sublimation chamber in which a solid raw material with the lowest gasification temperature is contained, wherein $t1>100°$ C.

* * * * *